(12) United States Patent
Youker et al.

(10) Patent No.: US 7,405,475 B2
(45) Date of Patent: Jul. 29, 2008

(54) METHOD AND SYSTEM OF TAPE AUTOMATED BONDING

(75) Inventors: Nick A. Youker, River Falls, WI (US); Ronald L. Anderson, Lino Lakes, MN (US); John E. Hansen, Coon Rapids, MN (US)

(73) Assignee: Cardiac Pacemakers, Inc., St. Paul, MN (US)

( * ) Notice: Subject to any disclaimer, the term of this patent is extended or adjusted under 35 U.S.C. 154(b) by 0 days.

(21) Appl. No.: 11/683,586

(22) Filed: Mar. 8, 2007

(65) Prior Publication Data

US 2007/0145566 A1 Jun. 28, 2007

Related U.S. Application Data

(62) Division of application No. 09/970,145, filed on Oct. 2, 2001, now Pat. No. 7,190,069.

(51) Int. Cl.
*H01L 23/14* (2006.01)
*H01L 23/34* (2006.01)

(52) U.S. Cl. .................. 257/702; 257/723; 257/724; 257/E23.065

(58) Field of Classification Search .............. 257/702, 257/723, 724, E23.065
See application file for complete search history.

(56) References Cited

U.S. PATENT DOCUMENTS

| 4,811,081 A * | 3/1989 | Lyden ..................... 257/668 |
|---|---|---|
| 4,862,322 A | 8/1989 | Bickford et al. |
| 4,903,113 A | 2/1990 | Frankeny et al. |
| 5,400,219 A | 3/1995 | Reele et al. |
| 5,414,299 A * | 5/1995 | Wang et al. ............... 257/702 |
| 5,474,957 A * | 12/1995 | Urushima .................. 29/827 |
| 5,477,082 A | 12/1995 | Buckley, III et al. |
| 5,587,341 A | 12/1996 | Masayuki et al. |
| 5,677,203 A | 10/1997 | Rates |
| 5,892,271 A | 4/1999 | Takeda et al. |
| 5,896,651 A | 4/1999 | Hawthorne |
| 6,262,488 B1 | 7/2001 | Masayuki et al. |
| 6,268,645 B1 | 7/2001 | Takenaka et al. |
| 6,323,058 B1 * | 11/2001 | Murakamz et al. ......... 438/106 |
| 2002/0109213 A1 * | 8/2002 | Kovac et al. ............... 257/668 |

FOREIGN PATENT DOCUMENTS

WO    WO-99/18611    4/1999

* cited by examiner

*Primary Examiner*—Nitin Parekh
(74) *Attorney, Agent, or Firm*—Schwegman, Lundberg & Woessner, P.A.

(57) ABSTRACT

A tape automated bonding (TAB) structure which includes a flex tape having a conductive lead pattern formed thereon. The conductive lead pattern includes a plurality of leads configured to form an inner lead bond (ILB) portion of the TAB structure. At least one of the plurality of leads is internally routed and has a contact exposed interior to the ILB portion of the TAB structure.

14 Claims, 5 Drawing Sheets

METHOD AND SYSTEM OF TAPE AUTOMATED BONDING

CROSS-REFERENCE TO RELATED APPLICATIONS

This application is a division of U.S. application Ser. No. 09/970,145, filed on Oct. 2, 2001, now U.S. Pat. No. 7,190,069, which is incorporated herein by reference.

FIELD OF THE INVENTION

This invention relates to the field of integrated circuit packaging and more specifically to a method and system of tape automated bonding for an integrated circuit for an implantable medical device such as a defibrillator, pacemaker, or cardioverter.

BACKGROUND

Patients prone to irregular and sometimes life threatening heart rhythms sometimes have miniature defibrillators, cardioverters, and pacemakers implanted in their bodies, typically in the upper chest area above their hearts. These devices detect onset of abnormal heart rhythms and automatically apply corrective electrical therapy, specifically one or more bursts of electric current, to hearts. When the bursts of electric current are properly sized and timed, they restore normal heart function without human intervention, sparing patients considerable discomfort and often saving their lives.

The devices include a set of electrical leads, which extend from a housing into a heart after implantation. Within the housing, among other components, is electronic circuitry for detecting abnormal heart rhythms and for controlling the bursts of electric current through the leads to the heart. The electronic circuitry includes integrated circuits (ICs) which are mounted to a circuit board and connected to various other discrete electrical components by electrically conductive conduits between input/outputs (I/O's) of the IC and the various discrete electrical components.

One method of mounting the IC to the circuit board and providing the interconnections between the IC and the discrete components includes tape automated bonding (TAB). In TAB, interconnection leads are patterned on a flex tape. The tape is positioned above the bare IC chip so that the metal tracks on the tape correspond to I/O bonding sites on the perimeter of the chip. An outer portion of the TAB leads are then connected to contacts on the circuit board. The circuit board includes leads running from the contacts to the discrete electrical components. Since the implantable devices are typically implanted in the left region of the chest or in the abdomen, a smaller size device, which is still capable of performing complex cardiac rhythm management schemes, is desirable.

Accordingly, there is a need to provide a compact implantable device which is capable of performing complex cardiac rhythm management schemes. Furthermore, there is a need to provide methods of manufacturing devices and assembling structures such as the ICs within the implantable devices that provide more efficient and thus less expensive manufacturing.

SUMMARY

To address these and other needs, methods and systems for tape automated bonding have been devised. One aspect of the present system includes a TAB structure. In one embodiment, a TAB structure includes a tape having a conductive lead pattern formed thereon, wherein the conductive lead pattern includes a plurality of leads configured to form an inner lead bond (ILB) portion of the TAB structure. At least one of the plurality of leads is internally routed relative to the ILB portion and has a contact exposed interior to the ILB portion of the TAB structure.

One aspect of the present system includes an electrical device. In one embodiment, an electrical device includes a circuit board, an IC chip mounted to the circuit board, and an electrical component mounted above the IC chip and electrically connected to the IC chip via a lead extending from the electrical component to an I/O of the IC chip.

One aspect includes a method of interconnecting an IC chip to an electronic component. In one embodiment, a method includes connecting the IC to a TAB tape at an ILB portion of the TAB tape and connecting discrete components to one or more leads of the TAB tape at internal portions of the TAB tape within the ILB portion and above the IC chip.

DETAILED DESCRIPTION

In the following detailed description, reference is made to the accompanying drawings that form a part hereof, and in which are shown by way of illustration specific embodiments in which the invention may be practiced. It is understood that other embodiments may be utilized and structural changes may be made without departing from the scope of the present invention.

The increases in density that have occurred within ICs have made it possible to provide more functions in each IC, such as more logic gates or more memory bits. This increase in function has made it necessary in many cases to provide more interconnections per IC chip. IC chips have also grown in size to accommodate the larger number of individual circuits, gates or bits required for the expanded functions. The present system and method offers a technique of redistributing the I/O interconnections of an integrated circuit. In one example, a TAB leadframe is utilized to embody the technique.

Figure 1:
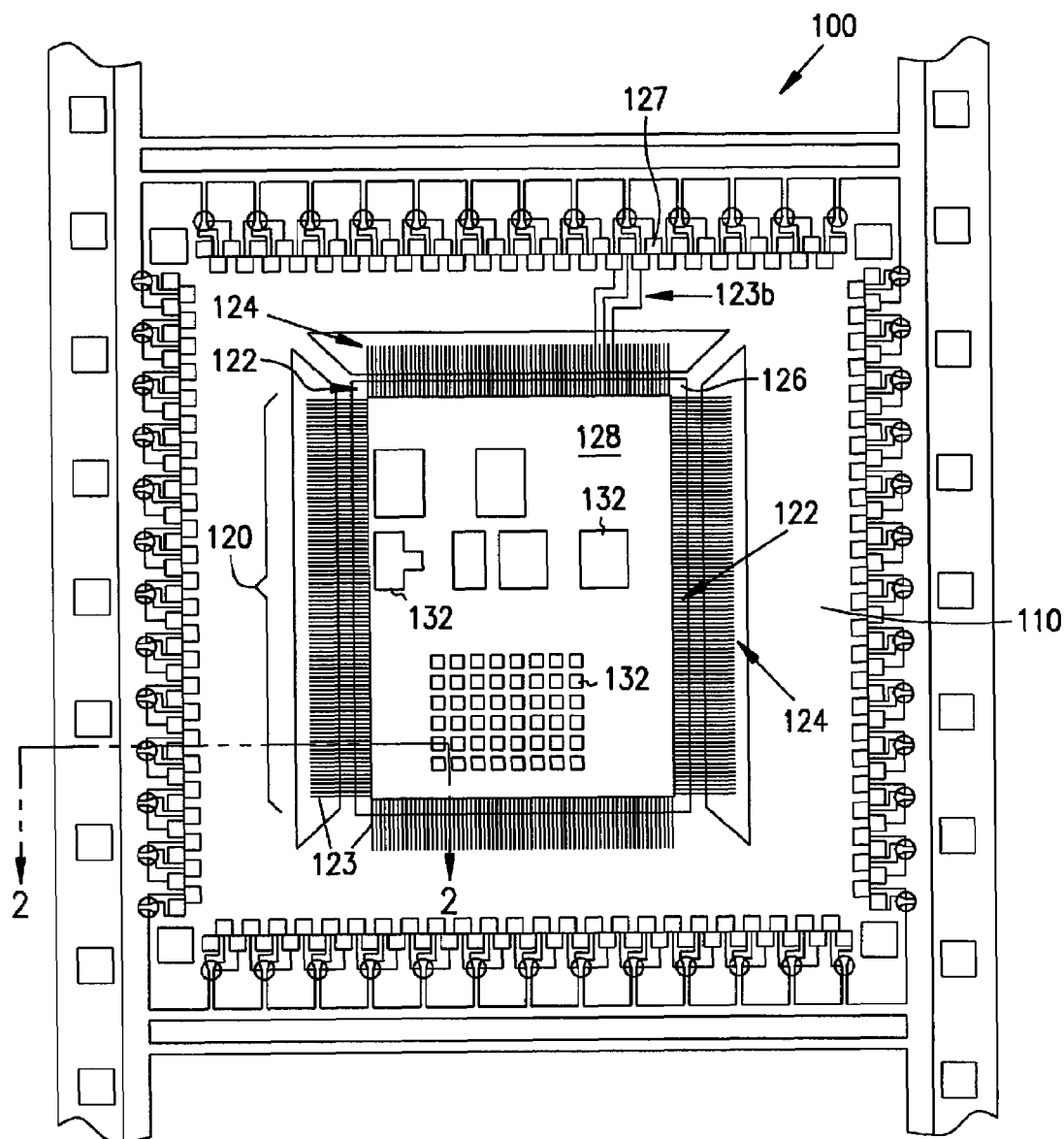
FIG. 1 shows a top view of a TAB structure according to one embodiment.
Figure 2:
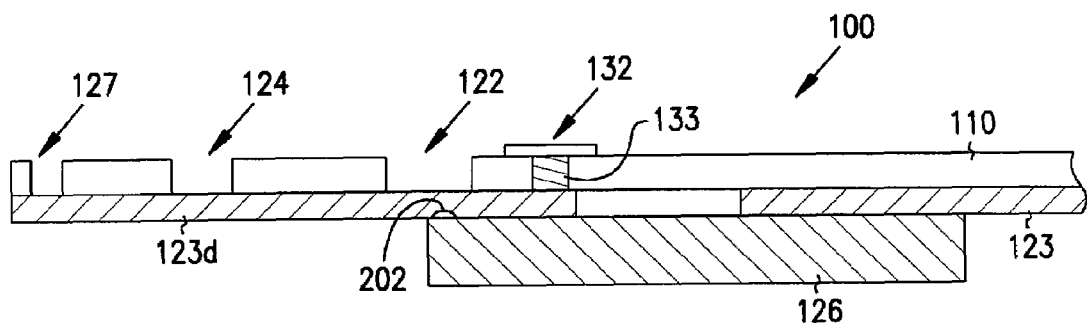
FIG. 2 shows a sectional side view of the TAB structure of FIG. 1.
Figure 3:
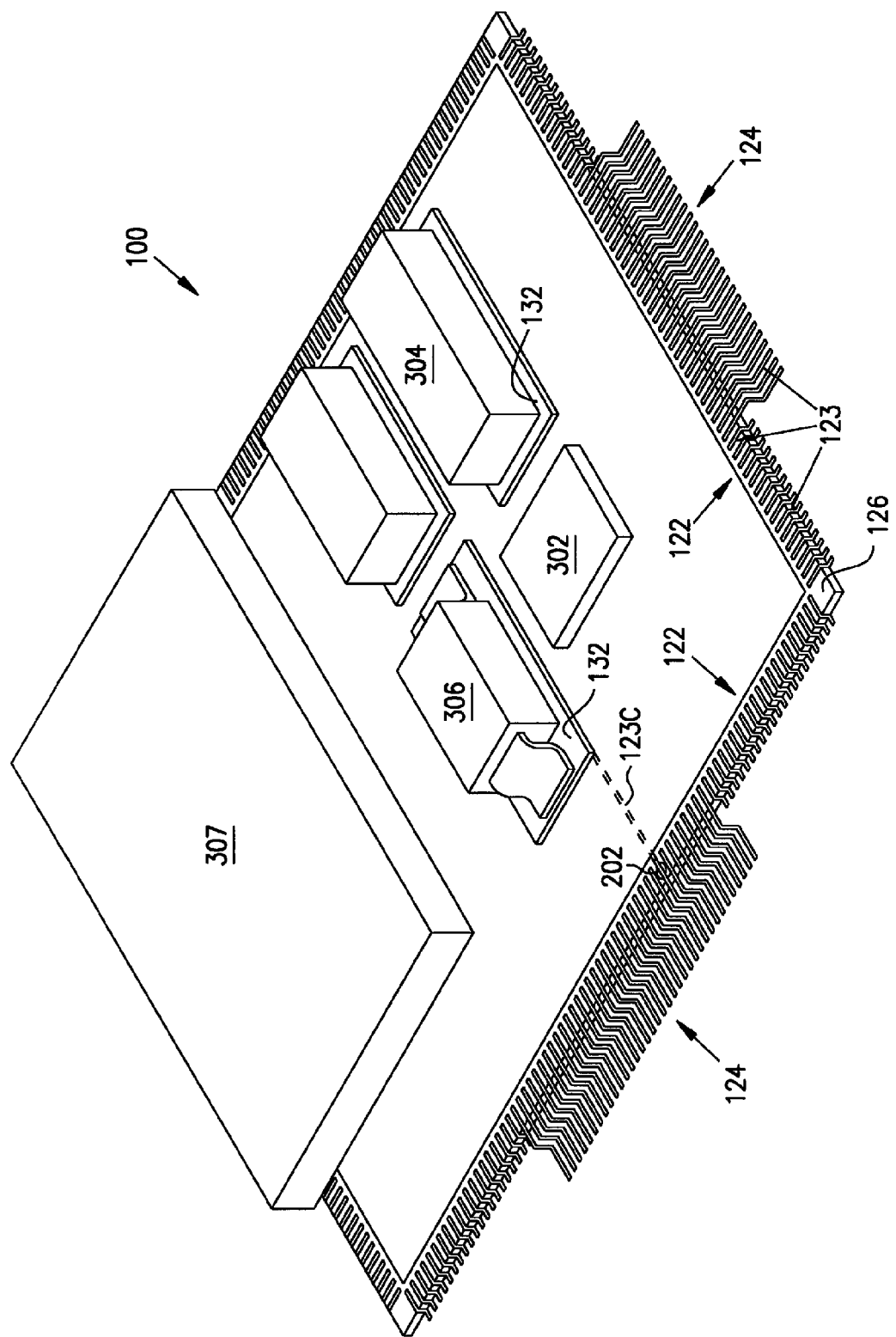
FIG. 3 is an isometric view of the TAB structure of FIG. 1 having electrical components mounted thereto.

FIGS. 1-3 show a TAB structure 100 according to one embodiment. FIG. 1 shows a top view of TAB structure 100. TAB structure 100 is one of a plurality of similar TAB leadframe structures that are located in a series along a sprocketed tape 110. Each TAB structure 100 includes tape 110, such as polyimide or other flex tape, having a conductive lead pattern 120 formed thereon. The TAB structure 100 provides the necessary connections for the perimeter bonded I/Os of an unpackaged or bare IC chip 126.

IC 126 includes a plurality of IO contact pads 202 (See FIG. 2) for providing coupling of the IC to outside components. The I/O contact pads can be located all around the perimeter circumference of a surface of the IC. By way of example, there can be anywhere from approximately 16 to 500 I/O contact pads or more on the chip. IC 126 can be a square or non-square rectangular chip.

In one embodiment, the conductive lead pattern 120 includes a copper etched and gold plated metallization on tape 110. In one example, in forming TAB structure 100, a conductor layer composed of Cu or the like is formed on a tape 110 composed of a material such as a polyimide tape or other flex tape. Thereafter, the conductor layer is etched out and thereby a conductive lead pattern is formed.

Conductive lead pattern 120 includes a plurality of leads 123. The leads 123 of conductive lead pattern 120 include an inner lead bond (ILB) portion 122 and an outer lead bond (OLB) portion 124. One or more of the IC chip I/O contact pads 202 connect to the one or more of leads 123 at the ILB portion 122 when the IC chip is mounted within an inner frame section 128 of TAB 100. The inner frame section 128 is dimensioned to hold IC 126 chip therein. OLB portion 124 is for connecting the IC chip to a circuit board, for example. Accordingly, a conductive path is formed from the ILB portion 122 at the I/O of the IC to the OLB portion 124 which is connected to a circuit board.

One or more of the plurality of leads 123 of TAB structure 100 includes internally located contacts 132. Contacts 132 are located within frame section 128 and are connected interiorly relative to ILB portion 122. Among other advantages, this allows one or more components to be mounted on or above the surface of the IC and thus within the perimeter of the IC, thus not using up any more footprint area upon a circuit board. In one example, the internally running leads are formed in the same manner along with the rest of lead pattern 120. Since TAB leadframe cost is relatively constant even with added complexity, the present system does not cause any significant incremental cost to manufacturing or assembly of the TAB.

In one embodiment, a plurality of test contact pads 127 are located on the TAB structure and are connected to one or more of leads 123. For example, FIG. 1 shows example leads 123b connected to test contact pads 127. In some embodiments, each of the plurality of leads 123 are connected to test contact pads. Other embodiments only connect one or more of leads 123 to contact test pads. The present example is shown for sake of clarity. The present TAB structure having test contact pads 127 allows for "known-good-die" testing. Known-good-die testing is electrical testing or burn-in of the integrated circuit prior to committing the expensive discrete components to the overall electrical assembly. Accordingly, in one example use of the present TAB system, once the ILB TAB bonds are completed, the IC 126 can be electrically tested using test contact pads 127 to verify that the circuit is stable and capable of meeting the rigors and high quality standards needed of an implantable defibrillator or pacemaker or other implantable device. The present embodiment accommodates known-good-die testing while still optimizing the surface area utilization above the IC in the form of active circuitry. This results in a smaller, more comfortable, and more reliable implantable device. Moreover, the present structure allows the packaging designer to optimize the circuit board or hybrid surface area which helps to minimize overall device volume while still allowing for complex electronic functions.

One advantage of the present structure is that it allows for reductions in electrical impedance between the IC and the associated discrete electrical components due to the very short and direct connections between the IC and the components mounted above the IC. The structure also reduces the number of electrically redundant interconnects between the IC, the components above the chip, and the hybrid (motherboard) by utilizing a continuous stitch TAB inner lead bond approach to make the necessary electrical connections. In the past, the IC was connected to the hybrid, such as a circuit board, and then a lead went from the hybrid to the component. Now a component can utilize the TAB lead itself as the component's direct interconnect.

Moreover, the present internal contacts 132 allow for lower cost and less complex manufacturing. This is because the internal contacts 132 allow a component to be mounted with a one-step manufacturing process to the IC. A typical two-step process of first mounting the component to the circuit board and then connecting the component to the IC is reduced to mounting the component directly within the frame of the TAB structure with its built-in connection.

FIG. 2 shows a schematic representation of a cross-section of portions of TAB structure 100. In this embodiment, example lead 123D extends from a test contact pad 127 to OLB portion 124 to ILB portion 122 and to inner contact 132 located above the major surface of chip 126. In this example, a conductive filler material 133 is used to make the connection between lead 123D and inner contact 132.

Chip 126 includes I/O contact 202 for making the connection to the lead. In other examples a lead such as lead 123D can extend only inward, for example, from ILB 122 to contact 132. Other leads extend only outward, for example, from ILB 122 to OLB 124.

FIG. 3 is an isometric view of TAB structure 100 having electrical components, such as components 302, 304, 306, and 307, mounted thereto. In this example, ILB portions 122 are connected to the I/Os of chip 126 and OLD portions 124 have been bent into a gull-wing configuration in preparation for mounting onto a circuit board. An example lead 123C runs from IC I/O 202 to inner contact 132. Components 302, 304, 306, and 307 can be soldered to contacts 132. Alternatively they can be connected by an electrically conductive epoxy. Other equivalent connection techniques are within the scope of the present system.

Figure 4:
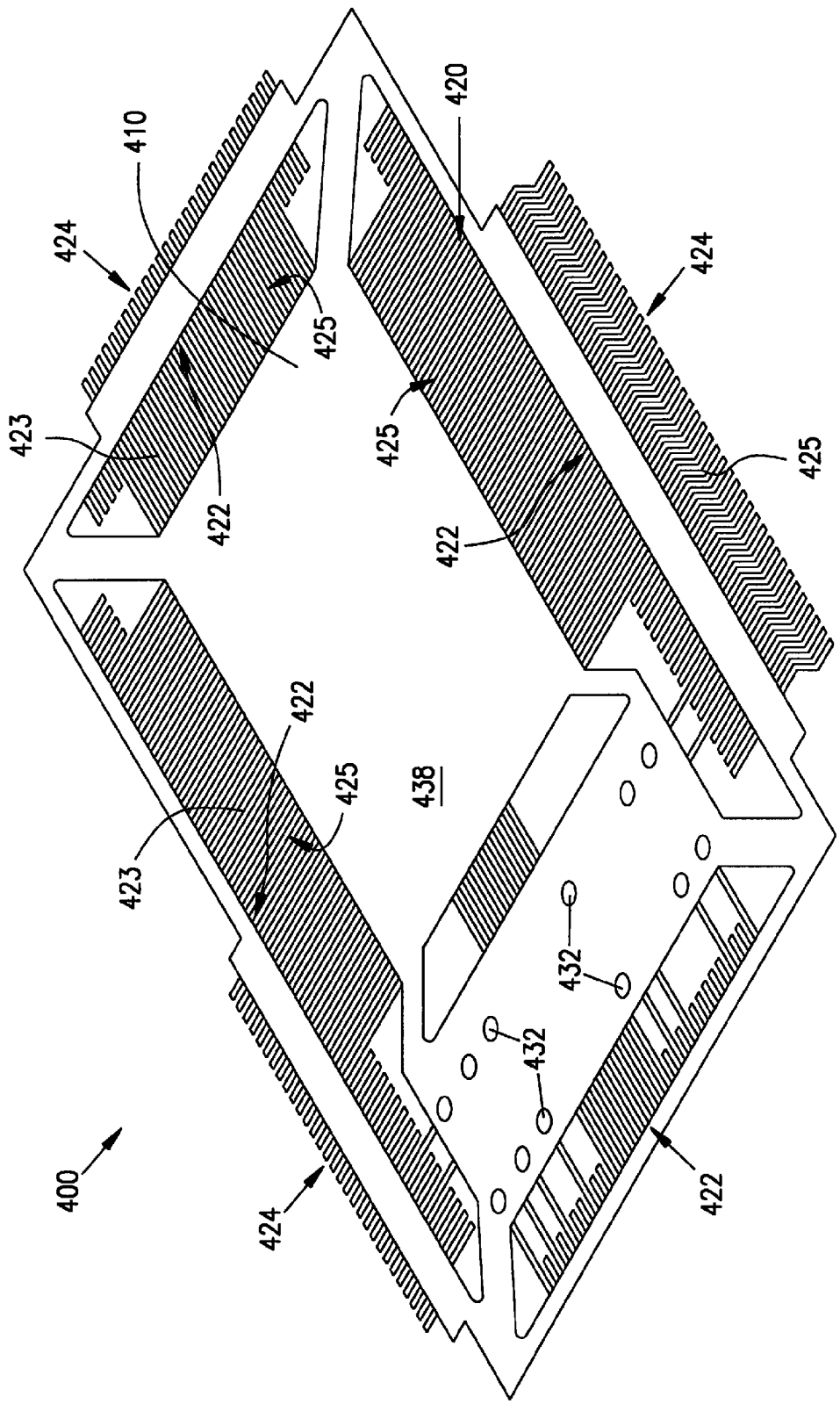
FIG. 4 shows a top view of a TAB structure according to one embodiment.
Figure 5:
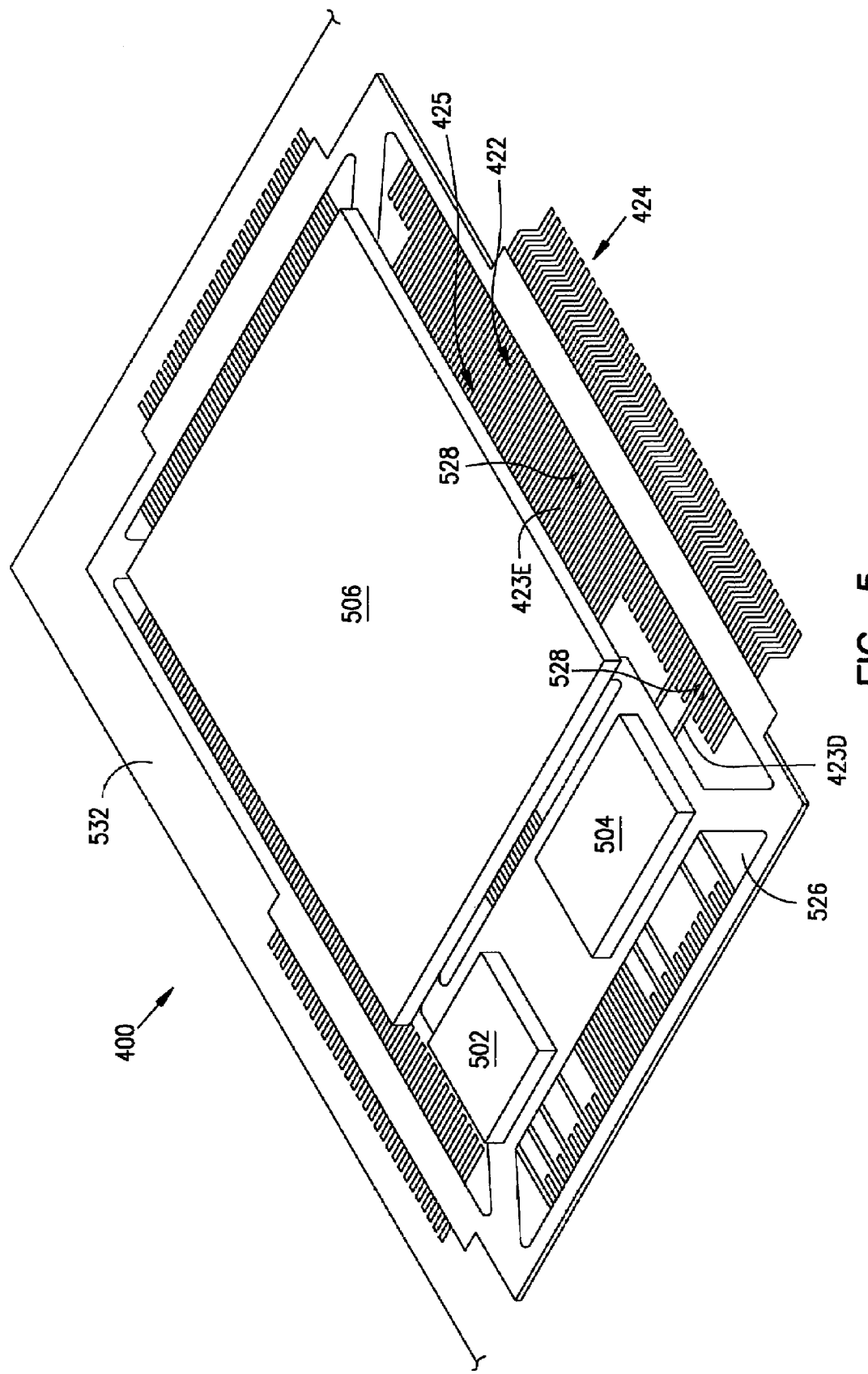
FIG. 5 shows an isometric view of the TAB structure of FIG. 4 having electrical components mounted thereto.

FIGS. 4 and 5 show a TAB structure 400 according to one embodiment. FIG. 4 shows an isometric view of TAB structure 400. Tab structure 400 includes similar features to TAB structure 100 and certain details will be omitted for sake of clarity. TAB structure 400 generally includes a tape 410 having a conductive lead pattern 420 formed thereon. Conductive lead pattern 420 includes a plurality of leads 423. The leads 423 of conductive lead pattern 420 include an ILB portion 422 and an OLB portion 424.

One or more of the plurality of leads 423 of TAB structure 400 includes internally located contacts 432. Contacts 432 are located within frame section 438 and are connected interiorly relative to ILB portion 422. This allows one or more components to be mounted above the surface of an IC and thus within the perimeter of the IC, thus not using up any more footprint area upon a circuit board.

In one embodiment, TAB structure 400 includes internally located contacts 425. In this example, inner contacts 425 do not include contact pads such as provided for inner contacts 432. Inner contacts 425 include a bare portion of portions of each of one or more of leads 423 and are internally located relative to ILB portion 422. Again, inner contacts 425 allow one or more components to be mounted above the surface of the IC and within the perimeter of the IC, thus not using up any more footprint area upon a circuit board.

FIG. 5 is an isometric view of TAB structure 400 having an IC chip 526 mounted thereto and having electrical components, such as components 502, 504, 506 and so on, mounted thereto. ILB portions 422 are connected to the I/Os 528 of chip 526 and OLB portions 424 have been bent into a gull-wing configuration in preparation for mounting onto a circuit board 532. In this example, lead 423D is attached to an I/O 528 of IC 526. One end of lead 423D extends to OLB portion 424 and a second end extends to an inner contact 432 (see FIG. 4), which in FIG. 5 has a component 504 mounted thereon. Again, the present TAB structure provides that components such as component 504 do not take up any space on the surface of the circuit board.

This example also shows a lead 423E connected to an I/O 528 of the IC. Lead 423E includes a first end extending to OLB portion 424 and a second end extending internally to inner contact 425, where inner contact 425 is attached to the I/Os of component 506. In this example, component 506 is an IC chip having similar I/Os as shown for IC chip 526. Thus, the present embodiment allows the back-to-back, internally located mounting of a second IC chip 506 relative to a first IC chip 526.

Figure 6:
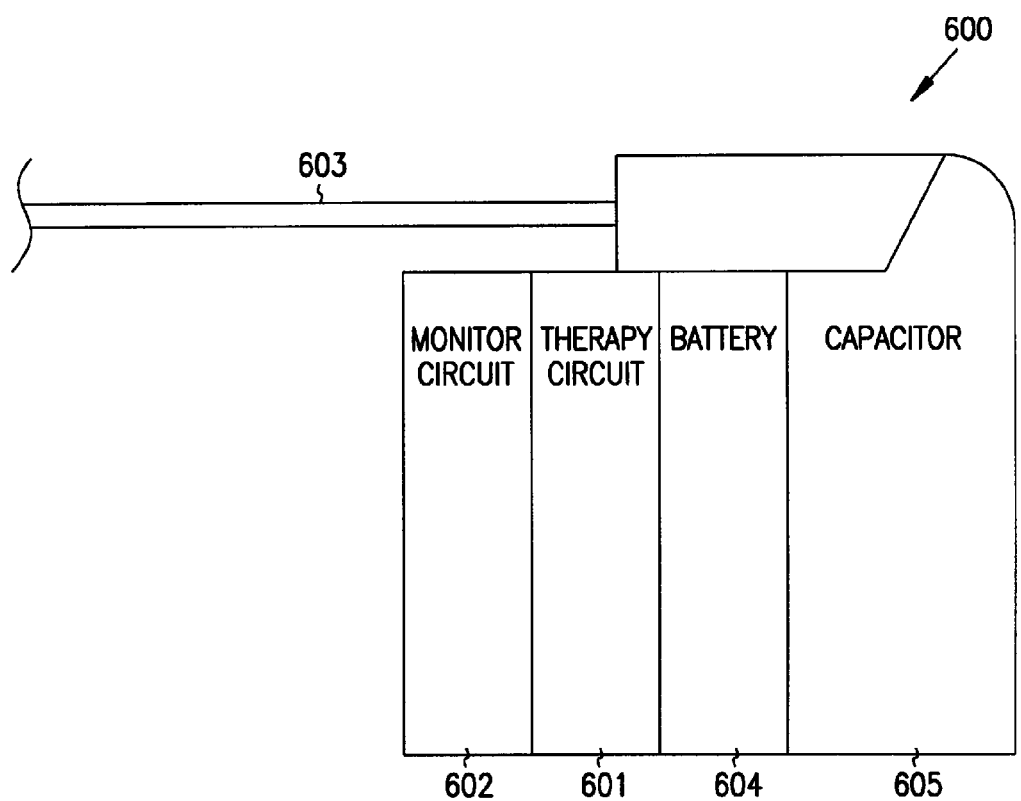
FIG. 6 shows a block diagram of a generic implantable device including an electrical circuit in accordance with one embodiment.

FIG. 6 shows one of the many applications for circuit boards incorporating one or more teachings of the present TAB system: a generic implantable device 600. As used herein, implantable device includes an implantable device for providing therapeutic stimulus to a heart muscle. Thus, for example, the term includes pacemakers, defibrillators, cardioverters, congestive heart failure devices, and combinations of these devices.

Device 600 includes a lead system 603, which after implantation electrically contacts strategic portions of a patient's heart. Shown schematically are portions of device 600 including electrical circuitry such as a monitoring circuit 602 for monitoring heart activity and for detecting abnormal heart rhythms through one or more of the leads of lead system 603, and a therapy circuit 601 for controlling and delivering bursts of electrical energy through one or more of the leads to a heart. Device 600 also includes an energy storage component, which includes a battery 604 and a capacitor 605. Therapy circuit 601 and monitoring circuit 602 can both include circuit boards or hybrids having electrical devices which include one or more of the TAB features described above. In one example, the electrical circuitry of device 600 includes application-specific integrated circuits (ASICs) to monitor, regulate, and control the delivery of electrical impulses to the heart. The present TAB structure allows a packaging designer to increase hybrid efficiency by turning the otherwise passive IC surface into an electrically active design element and therefore offering a significant reduction in the size of implantable device 600.

It is understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A tape automated bonding (TAB) structure for connecting a chip having one or more perimeter I/Os to a circuit board, the TAB structure comprising:
    a TAB flex tape having a conductive lead pattern formed thereon, the conductive lead pattern including a plurality of leads configured to form an inner lead bond (ILB) area to connect to the one or more perimeter I/Os of the chip and an outer lead bond (OLB) area to connect to the circuit board, wherein at least one of the plurality of leads is internally routed relative to the ILB area so that the at least one lead has a contact exposed interior to the ILB portion of the TAB structure such that the at least one lead is configured to extend from a perimeter I/O of the chip inward to an electronic component mounted over the chip.

2. The TAB structure of claim 1, wherein the contact is positioned for mounting a discrete electrical component on or above a major surface of the chip.

3. The TAB structure of claim 1, wherein at least one of the plurality of leads is connected to a test contact pad.

4. The TAB structure of claim 1, wherein the ILB area has a generally rectangular shape.

5. The TAB structure of claim 1, wherein the OLB area has a generally rectangular shape.

6. The TAB structure of claim 1, wherein the TAB flex tape is a polyimide tape.

7. A tape automated bonding (TAB) structure for connecting a chip having one or more perimeter I/Os to a circuit board, the TAB structure comprising:
    a TAB flex tape having a conductive lead pattern formed thereon, the conductive lead pattern including a plurality of leads configured to form an inner lead bond (ILB) area to connect to the one or more perimeter I/Os of the chip and an outer lead bond (OLB) area to connect to the circuit board, wherein at least one of the plurality of leads is internally routed relative to the ILB area so that the at least one lead has a contact exposed interior to the ILB portion of the TAB structure to connect to an electrical component located on or above a surface of the chip, wherein the internally routed lead extends from a point which is within the ILB area of the TAB structure outward toward the OLB area of the TAB structure such that the internally routed lead is configured to extend from the electrical component to a perimeter I/O of the chip when the electrical component is mounted on or over the chip.

8. The TAB structure of claim 7, wherein at least one of the plurality of leads is connected to a test contact pad.

9. The TAB structure of claim 7, wherein the ILB area has a generally rectangular shape.

10. The TAB structure of claim 7, wherein the OLB area has a generally rectangular shape.

11. The TAB structure of claim 7, wherein the TAB flex tape is a polyimide tape.

12. A tape automated bonding (TAB) structure for connecting a chip having one or more perimeter I/Os to a circuit board, the TAB structure comprising:
    a TAB flex tape having a conductive lead pattern formed thereon, the conductive lead pattern including a plurality of leads configured to form a generally rectangular inner lead bond (ILB) area to connect to the one or more perimeter I/Os of the chip and a generally rectangular outer lead bond (OLB) area to connect to the circuit board,
    wherein at least one of the plurality of leads is internally routed relative to the ILB area so that the at least one lead has a contact exposed interior to the ILB portion of the TAB structure and above a major surface of the IC chip to connect to an electrical component located on or above a surface of the IC chip, wherein the internally routed lead extends from a point which is within an inner portion of the TAB structure outward toward an outer portion of the TAB structure such that the lead is configured to extend from the electrical component to a perimeter I/O of the IC chip when the electrical component is mounted on or over the chip.

13. The TAB structure of claim 12, wherein at least one of the plurality of leads is connected to a test contact pad.

14. The TAB structure of claim 12, wherein the TAB flex tape is a polyimide tape.

* * * * *